(12) United States Patent
Wang

(10) Patent No.: US 7,074,721 B2
(45) Date of Patent: Jul. 11, 2006

(54) METHOD FOR FORMING THICK COPPER SELF-ALIGNED DUAL DAMASCENE

(75) Inventor: Sung-Hsiung Wang, Kaohsiung (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 283 days.

(21) Appl. No.: 10/407,082

(22) Filed: Apr. 3, 2003

(65) Prior Publication Data

US 2004/0198055 A1 Oct. 7, 2004

(51) Int. Cl.
*H01L 21/302* (2006.01)

(52) U.S. Cl. .................. 438/706; 438/509; 438/691; 438/710

(58) Field of Classification Search .............. 438/625, 438/653, 637, 643, 700, 706, 710, 720, 691, 438/692, 436, 509
See application file for complete search history.

(56) References Cited

U.S. PATENT DOCUMENTS

| 6,368,967 | B1 * | 4/2002 | Besser ........................ 438/687 |
| 6,566,260 | B1 * | 5/2003 | Chooi et al. ................ 438/687 |
| 6,686,280 | B1 * | 2/2004 | Shue et al. ................. 438/675 |
| 6,696,760 | B1 * | 2/2004 | Powers ....................... 257/758 |

* cited by examiner

*Primary Examiner*—Lan Vinh
(74) *Attorney, Agent, or Firm*—Tung & Associates

(57) ABSTRACT

A method for forming a void free ultra thick dual damascene copper feature providing a semiconductor process wafer comprising via openings formed in a first undoped silicate glass (USG) layer the first USG layer having an overlying a second USG layer formed having a thickness of greater than about 1 micron and an overlying silicon oxynitride BARC layer; forming a trench opening having a width of greater than about 1 micron to encompass one of the via openings; forming a barrier layer to line the dual damascene opening; forming a copper seed layer having a thickness of from about 1000 Angstroms to about 2000 Angstroms; carrying out a multi-step electrochemical deposition (ECD); and, carrying out a two step copper annealing process.

18 Claims, 3 Drawing Sheets

METHOD FOR FORMING THICK COPPER SELF-ALIGNED DUAL DAMASCENE

FIELD OF THE INVENTION

This invention generally relates to semiconductor processing methods for forming metal contacts in a multilevel semiconductor device and more particularly a method for forming ultra-thick copper features including bonding pads and an immediately lower metallization level of vias by a self-aligned dual damascene process.

BACKGROUND OF THE INVENTION

Formation of multi-level semiconductor devices entails the formation of multiple levels of metal interconnects such as vias and trench lines (local interconnect lines). For example, in a multi-level semiconductor device there are frequently formed uppermost metallization layers that include relatively wide metal areas, such as bonding pads having a linewidth and depth of about 1 micron to about 5 microns which are connected to lower lying metallization layers through relatively narrow metal filled holes, also referred to as vias. Frequently, several vias will connect a bonding pad in an uppermost metallization layer in one metallization level to an underlying metallization level through several relatively narrower vias. For example the underlying vias and metal interconnect lines are typically formed with line widths having a dimensions of from about 0.25 microns and smaller. The electrical continuity of the various metal interconnects, particularly through the vias is critical to proper functionality of a device.

Copper and copper alloys are increasingly becoming the metal of choice in forming damascene structures as it has improved electrical resistivity and electrical migration resistance compared to aluminum, previously widely used as a metallization metal. The use of copper, however, has presented several manufacturing problems that must be overcome for successful implementation of the technology. For example, copper cannot be successfully etched to form metal lines since it does not form volatile components with known etching chemistry's. As a result, copper lines must be formed as metal inlaid structures, also referred to as damascenes or dual damascenes where an anisotropically etched opening is formed in a dielectric insulating layer followed by filling the opening with copper and planarizing the wafer process surface by a chemical mechanical polishing step.

One damascene process that has been widely used for sub-micron metal linewidths, for example less than about 0.25 microns, is a dual damascene process whereby both an underlying via and an overlying metal interconnect line are simultaneously filled with copper. Prior art processes in forming the uppermost metallization layer, for example including bonding pads, have used a single damascene process to first form underlying vias and a single damascene process to form the overlying bonding pad. Some problems with the prior art process for forming bonding pads include the fact is that it is costly in terms of cycle time to first form a single damascene via and then a single damascene overlying bonding pad. A cycle time and material processing costs are increased by forming an intervening copper capping layer to protect the copper via from exposure to the atmosphere, which may tend to cause acidic corrosion due to residual sulfur compounds remaining from an electrochemical plating process. Frequently, extensive cleaning and environmental storage processes must be undertaken to protect the top portions of the copper vias from such corrosive reactions, which tend to increase an electrical resistance and adversely affect overlying material layer adhesion.

There is therefore a need in the semiconductor manufacturing art for an improved method to form ultra-thick damascene copper features including bonding pads to avoid corrosive attack of underlying copper filled vias while reducing a cycle time and processing cost.

It is therefore an object of the invention to provide an improved method to form ultra-thick damascene copper features including bonding pads to avoid corrosive attack of underlying copper filled vias while reducing a cycle time and processing cost in addition to overcoming other deficiencies and shortcomings of the prior art.

SUMMARY OF THE INVENTION

To achieve the foregoing and other objects, and in accordance with the purposes of the present invention, as embodied and broadly described herein, the present invention provides a method for forming a void free ultra thick dual damascene copper feature including providing a semiconductor process wafer comprising via openings formed in a first undoped silicate glass (USG) layer the first USG layer having an overlying a second USG layer formed having a thickness of greater than about 1 micron and an overlying silicon oxynitride BARC layer; forming a trench opening having a width of greater than about 1 micron to encompass at least one of the via openings while simultaneously etching away the silicon oxynitride BARC layer; forming a barrier layer to line the dual damascene opening; forming a copper seed layer having a thickness of from about 1000 Angstroms to about 2000 Angstroms; carrying out a multi-step electrochemical deposition (ECD); and, carrying out a two step copper annealing process.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the method of the present invention is explained with reference to, and is particularly advantageously implemented in forming an uppermost relatively thick copper metallization layer having a thickness of from about 1 microns to about 5 microns, preferably greater than about 1.5 microns, and an immediately lower copper metallization layer including vias, it will be appreciated that the method of the present invention may be advantageously used to form dual damascene copper structures having a relatively thick copper layer having a thickness of from about 1 microns to about 5 microns, thereby avoiding the processing costs of a single damascene process and avoiding oxide layer formation or atmospheric initiated corrosion of underlying copper features. Further, damascene features having widths of about 1 micron to about 100 microns, including bonding pads, may advantageously be formed according to the method of the present invention.

Figure 1A:
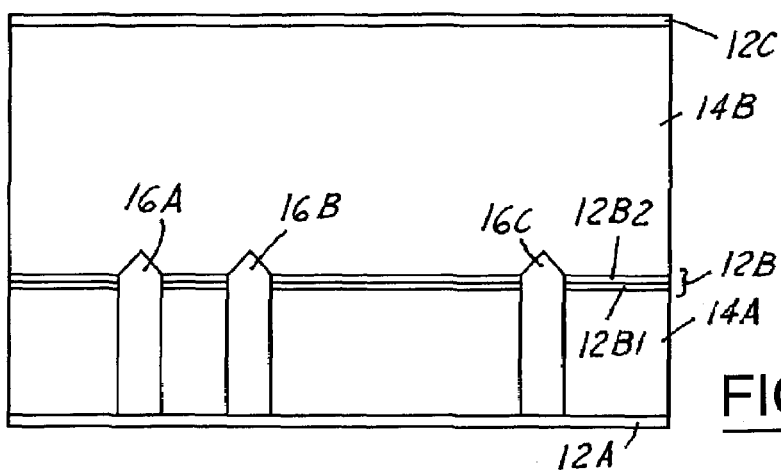
FIGS. 1A–1F are cross sectional side views of a portion of a multi-level semiconductor device showing manufacturing stages according to an embodiment of the present invention.

In an exemplary embodiment of the present invention, reference is made to FIGS. 1A–1F where cross sectional views of a portion of a multi-level semiconductor device are shown at stages of manufacture according to an exemplary self-aligned dual damascene process according to an embodiment the invention. Shown in FIG. 1A is a lowermost first etch stop layer 12A, preferably silicon nitride formed by an LPCVD or PECVD process to a thickness of about 300 to about 600 Angstroms. Formed overlying the first etch stop layer 12A is a first dielectric insulating layer 14A, preferably undoped silicate glass (USG) formed by a PECVD or HDP-CVD process to a thickness of about 6000 to about 8000 Angstroms. Formed over the first dielectric insulating layer 14A, also referred to as an inter-layer dielectric (ILD) layer, is a second etch stop layer 12B, for example a silicon nitride layer 12B1 formed having a thickness of about 600 Angstroms to about 1000 Angstroms. Optionally, an overlying bottom anti-reflectance coating (BARC) of silicon oxynitride e.g., 12B2, for example from about 100 Angstroms to about 500 Angstroms may be added over the silicon nitride layer 12B1 to reduce undesired light reflections in a photolithographic patterning step to forming openings in ILD layer 14A and improve an etching resistance of the etch stop layer 12B to improve an etching profile of a subsequent dual damascene structure. For example, an underlying silicon nitride layer e.g., 12B1 of about 400 Angstroms to about 700 Angstroms and an overlying silicon oxynitride layer e.g., 12B2 of about 100 Angstroms to about 300 Angstroms is used to form the etch stop layer 12B.

Still referring to FIG. 1A, vias e.g., 16A, 16B and 16C, for example having a line width of about 0.35 microns or less are formed by a conventional photolithographic and reactive ion etch (RIE) process where the via is etched through a portion of the thickness of ILD layer 14A, preferably at least partially exposing the first etch stop layer 12A.

Referring to FIG. 1A, following photoresist stripping and cleaning of the process wafer, a relatively thick dielectric insulating layer (ILD layer) 14B, preferably formed of USG is deposited by a PECVD or HDP-CVD process to a thickness of greater than about 1 micron, more preferably from about 1.5 microns to about 5 microns, for example about 3.5 microns. The via openings e.g., 16A, 16B and 16C, are preferably closed only over a top portion by the ILD layer 14B. Following formation of the ILD layer 14B and an oxide CMP process, a hardmask layer 12C formed of silicon oxynitride (e.g., SiON) by a PECVD or HDP-CVD process to a thickness of about 400 Angstroms to about 800 Angstroms is blanket deposited over the ILD layer 14B. The hardmask layer also functions as a BARC layer in a subsequent photolithographic patterning step.

Figure 1B:
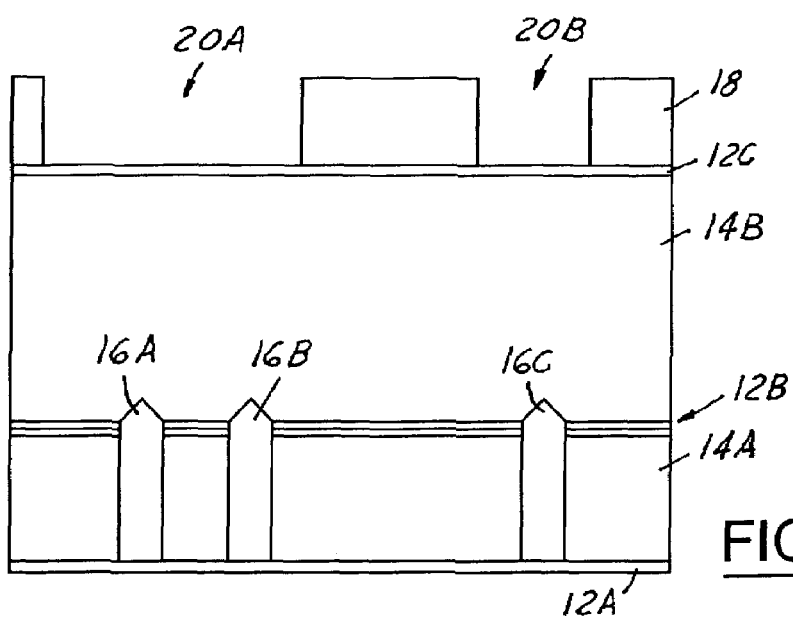

Referring to FIG. 1B, a photoresist layer 18 is photolithographically patterned to form relatively wide area trench opening patterns e.g., 20A and 20B overlying and encompassing one or more vias e.g., 16A, 16B and 16C. For example, the line width of the trench opening patterns are about 1 to about 5 microns, for example about 2.5 microns.

Figure 1C:
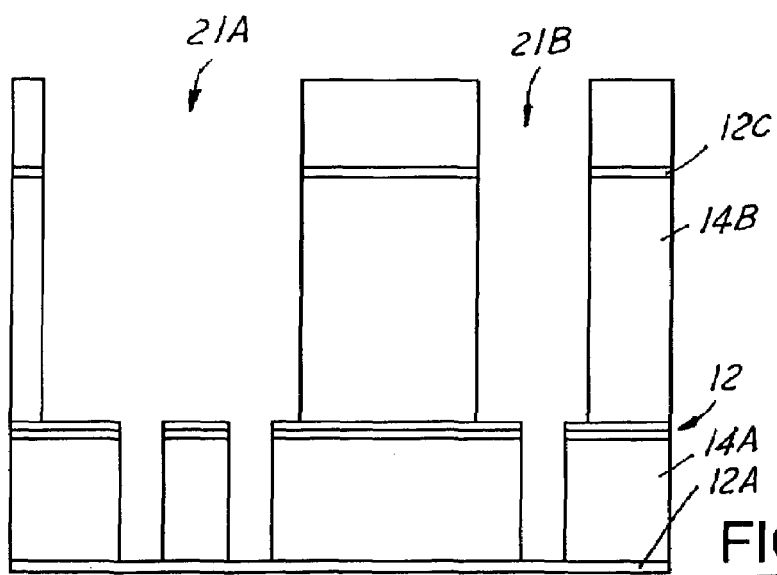

Referring to FIG. 1C, a multi-step RIE etching process is carried to first etch through the hardmask layer 12C and then through the ILD layer 14B to stop on etch stop layer 12B to form trench opening openings 21A and 21B overlying and encompassing one or more vias e.g., 16A, 16B and 16C.

Figure 1D:
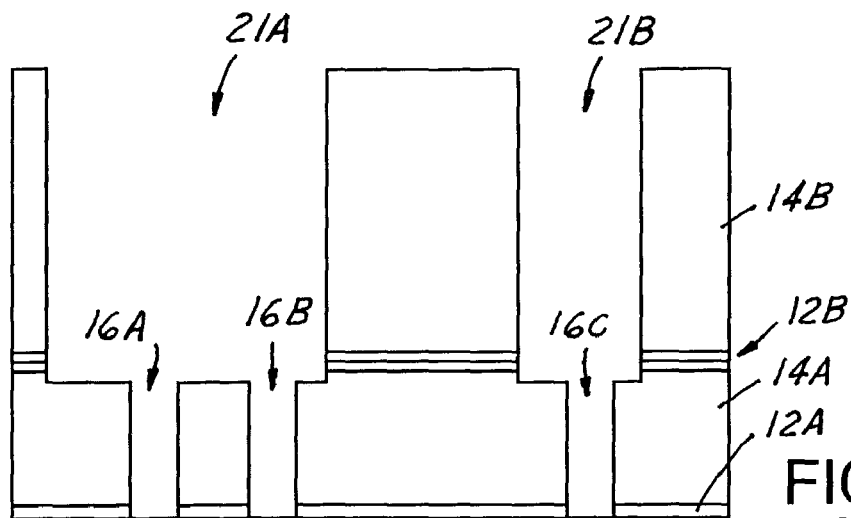

Referring to FIG. 1D, following stripping of the photoresist layer 18 and a wet wafer cleaning process, the trench openings 21A and 21B undergoes a second RIE etching process to etch through a thickness of etch stop layer 12B to include etching through a thickness portion of the underlying ILD layer 14A. For example the trench depth of trenches 21A and 21B are extended through the etch stop layer 12B and about 800 to about 1200 Angstroms into the underlying ILD layer 14A to complete the self-aligned dual damascene process. During the second RIE etching process, the overlying hardmask layer 12C is consumed (etched away) as is the first etch stop layer 12A. Preferably, after forming the dual damascene openings, the semiconductor process wafer is subjected to furnace prebake, for example in an atmospheric air ambient at a temperature of about 250° C. to about 350° C. for about 30 minutes followed by an in-situ sub-atmospheric degas at a pressure of about 1 Torr to about 20 Torr within a temperature range of about 250° C. to about 350° C. followed by an optional hydrogen or argon sputter/clean, to prepare the surface for chemical vapor deposition (CVD).

Figure 1E:
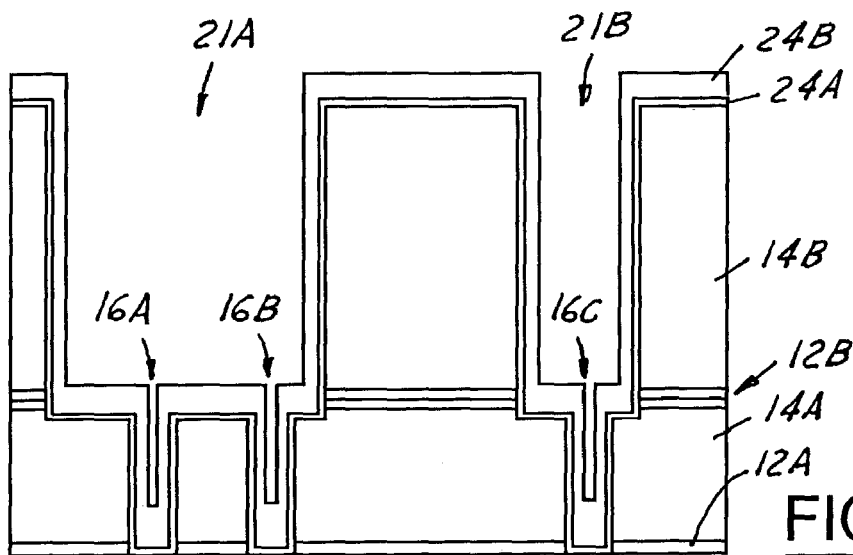

Referring to FIG. 1E, following the second RIE etching process, a barrier layer 24A of a refractory metal and/or a refractory metal nitride is deposited, the refractory metal and metal nitride formed preferably from titanium or tantalum. More preferably, the barrier layer is tantalum nitride (e.g., TaN). The tantalum nitride layer may be deposited by PVD of tantalum in a nitrogen containing ambient, however this process is less preferred due to inadequate step coverage, for example less than about 50% on the sidewalls and bottom of the dual damascene due to line of sight trajectories of the sputtered species. More preferably, the tantalum nitride layer is formed by an MOCVD process using tantalum metal organic precursors, for example Ethyltrikas Diethylamido Tantalum (ETDET) or TBTDET and ammonia ($NH_3$). The MOCVD process is preferably formed at a temperature of about 250° C. to about 450° C. at a pressure of about 3 to about 20 Torr and is optionally followed by a plasma treatment with an inert gas to densify the barrier layer. The barrier layer is preferably deposited to a thickness of about 200 Angstroms to about 400 Angstroms.

Still referring to FIG. 1E, following deposition of the barrier layer, a thick seed layer 24B of copper is deposited by PVD and/or CVD method to a thickness of about 1200 Angstroms to about 2000 Angstroms. The deposition of a thick seed layer is an important aspect of the present invention and advantageously aids a subsequent electrochemical deposition (ECD) process such that the openings may be filled without creating voids, especially in the underlying via openings. Preferably, a PVD process, for example using a collimated source is used to deposit the copper seed layer. Typically the step coverage on the sidewalls is from 10% to about 20% of bottom portion coverage, therefore preferential bottom coverage of the vias will prevent a forming closed off voids in a subsequent ECD process which tends to plate faster in an upper portion of the opening due to a higher current density.

Figure 1F:
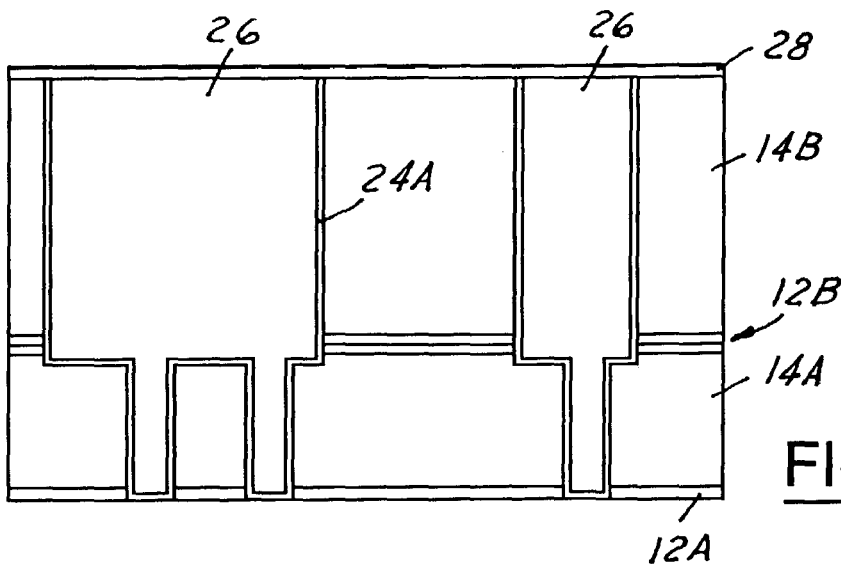

Referring to FIG. 1F, following formation of the thick copper seed layer 24B, an ECD process, for example using a conventional spaced apart electrode configuration and an electrolyte solution including copper sulfate is carried out to blanket deposit a copper layer 26 to fill the dual damascene openings. In one embodiment, the ECD process is carried out in copper plating steps followed by copper removal steps. For example, the current to the cathode electrode may be reversed, making the wafer the anode, to conformally remove a portion of the deposited copper layer 26. For example a first plating step from about ¼ to about ¾ of the depth of the trench opening is filled with the copper layer 26 followed by removal of about ⅙ to about ¼ the initially deposited thickness. The amount of copper deposited and removed in subsequent processes is gradually decreased by for example about 50 percent taking at least 3 plating cycles and 2 removing cycles to fill the dual damascene opening.

Following the filing of the dual damascene opening with copper layer 26 the process wafer is subjected to a first annealing process at about 200° C. to about 250° C. in air at atmospheric pressure which serves to outgas the copper to reduce the level of residual chemicals such as residual sulfates and reduce a stress, for example a compressive stress in the copper layer. Preferably the first annealing process is carried out for a period of about 5 minutes to about 30 minutes.

Still referring to FIG. 1F, the wafer is subjected to a conventional multi-step CMP process to remove the excess copper layer and the barrier layer above the trench level followed by an oxide buffing process. Preferably the amount of the second ILD layer 14B removed is limited to less than about 5000 Angstroms in the CMP process. Following the CMP process, the process wafer is subjected to a second annealing process at a temperature of about 300° C. to about 450° C. for about 20 minutes to about 60 minutes to further relieve stresses in the copper layer 26 to prevent hillock formation in a subsequent passivation layer deposition process and to increase the average size of the copper grains to lower electrical resistivity. Preferably the second annealing process in carried out in an inert, for example nitrogen and/or hydrogen gas atmosphere at atmospheric or sub-atmospheric pressure to prevent the formation of copper oxides at the copper surface. More preferably, the second annealing process is carried out in-situ at sub-atmospheric pressures prior to forming an overlying passivation layer. Following the annealing process a passivation layer 28 is formed over the wafer surface, for example silicon nitride deposited by a PECVD or HDP-CVD process carried out at a pressure of about 3 mTorr to about 100 mTorr at a temperature of less than about 450° C.

Figure 2:
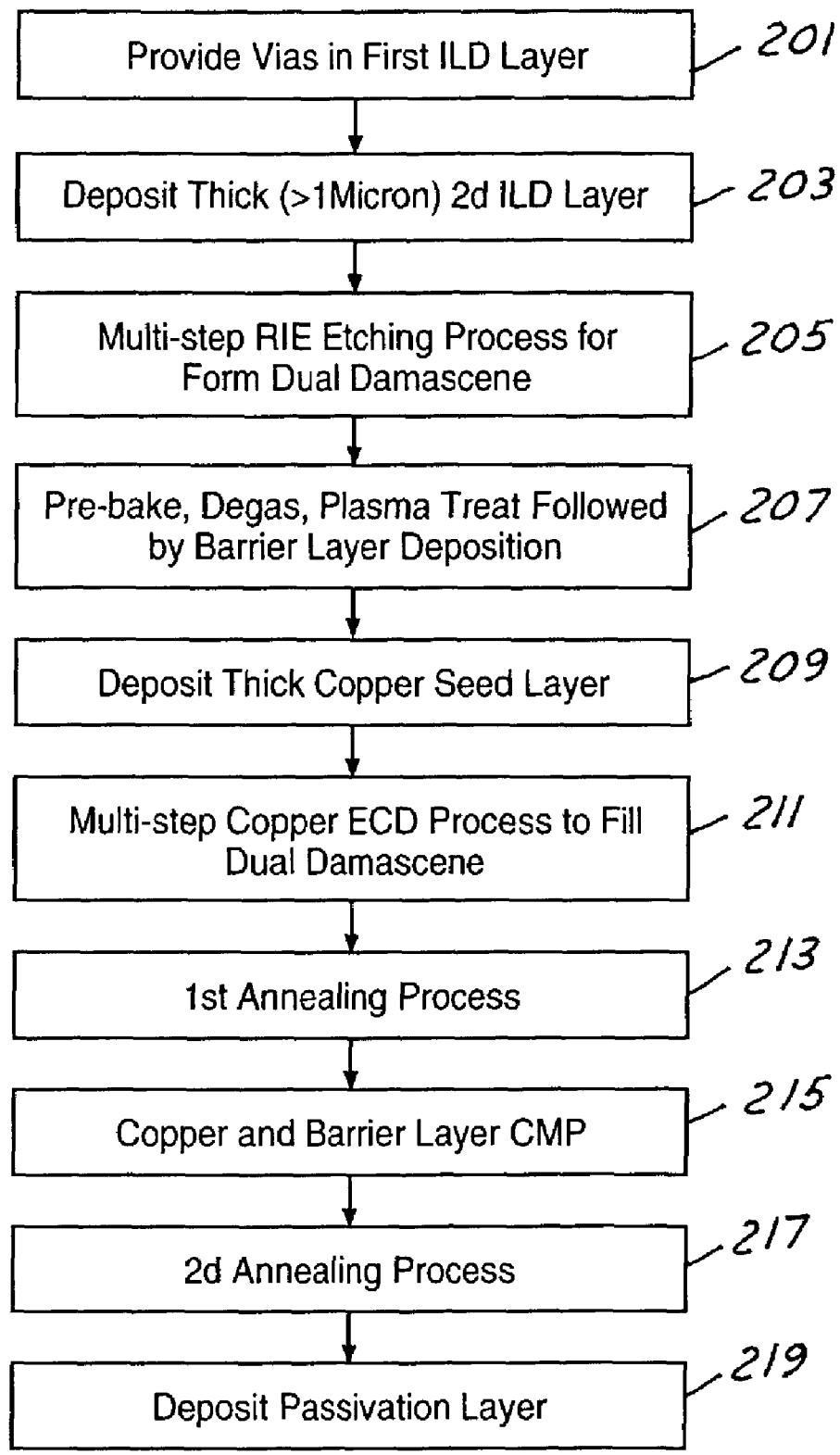
FIG. 2 is a process flow diagram including several embodiments of the present invention.

In FIG. 2 is shown a process flow diagram including several embodiments of the present invention. In process 201 a process wafer comprising via openings formed in a first ILD layer is provided. In process 203 a second ILD layer of greater than about 1 micron, is deposited over the first ILD layer. In process 205 wide trenches having a width of greater than about 1 micron are photolithographically patterned and anisotropically etched in a multi-step RIE etching process through a thickness of the second ILD layer and through a thickness portion of the first ILD layer to encompass one or more via openings to form a dual damascene. In process 207, a baking and degassing process precedes the deposition of a barrier layer preferably by a MOCVD method. In process 209 a thick copper seed layer is deposited to enhance copper filling without the formation of voids. In process 211, a multi-step copper ECD process is carried out to fill the dual damascene opening. In process 213, a first annealing process is carried out prior to a CMP process. In process 215, a CMP process is carried out to remove layers overlying the trench level. In process 217 a second annealing process is carried out. In process 219, a passivation layer is deposited to complete the formation of the ultra-thick dual damascene copper feature.

Thus, a method has been presented for reliably forming an ultra thick copper filled dual damascene structure overcoming the limitations of applying dual damascene processes to a relatively thick and wide copper feature overlying a relatively narrow copper feature. The method is particularly advantageous for forming an uppermost metallization layer, for example including wide conductive lines and bonding pads, thereby achieving an improvement in cycle time and cost over prior art single damascene processes. Further, an electrical resistivity is improved by avoiding oxide layer formation or atmospheric initiated corrosion over underlying copper feature interfaces.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an ultra thick dual damascene copper feature comprising the steps of:
    providing a semiconductor process wafer comprising via openings formed in a first dielectric insulating layer including an overlying etch stop layer;
    forming a second dielectric insulating layer thicker than the first dielectric insulating layer having a thickness of greater than about 1.0 microns over the first silicon oxide dielectric insulating layer;
    photolithographically patterning and anisotropically etching a trench opening having a width of greater than about 1 micron extending through the second dielectric insulating layer to the first dielectric insulating layer to encompass and expose at least one of said via openings to form a dual damascene opening;
    forming a barrier layer to line the dual demascene opening;
    forming a copper seed layer;
    carrying out an electrochemical copper deposition process to fill the dual damascene opening with a copper layer, wherein the ECD process comprises sequential deposition followed by partial removal of a portion of the copper layer deposition to reversed current flow;
    carrying out a first atmospheric ambient annealing process to anneal the copper layer;
    carrying out a CMP process to remove the copper layer and the barrier layer above the trench level; and,
    carrying out a second annealing process in an oxygen-free ambient to anneal the copper layer.

2. The method of claim 1, wherein the width and depth of the trench are from about 1 micron to about 5 microns.

3. The method of claim 1, wherein the barrier layer comprises at least one of a refractory metal and refractory metal nitride.

4. The method of claim 1, wherein the first annealing process is carried out at a temperature of from about 200° C. to about 250° C.

5. The method of claim 1, wherein the second annealing process is carried out comprising one or more of nitrogen and hydrogen in-situ prior to forming an overlying silicon nitride passivation layer.

6. The method of claim 1, wherein the first and second dielectric insulating layers comprise undoped silicate glass (USG).

7. The method of claim 1, wherein the step of trench etching comprises extending the trench portion into the first dielectric insulating layer while simultaneously removing an etch stop layer overlying the second dielectric insulating layer.

8. The method of claim 1, wherein the copper seed layer has a thickness of from about 1000 to about 2000 Angstroms.

9. A method for forming a void free ultra thick dual damascene copper feature comprising the steps of:

providing a semiconductor process wafer comprising via openings formed in a first dielectric insulating layer, the first dielectric insulating layer having a second dielectric insulating layer thicker than the first dielectric insulating layer covering an upper portion of the via openings;

photolithographically patterning and anisotropically etching a trench opening having a width of greater than about 1 micron to encompass and expose at least one of the via openings to form a dual damascene opening;

pre-baking at about 300° C. to about 350° C. followed by an in-situ sub-atmospheric step at about 350° C. to 300° C.

forming a barrier layer to line the dual damascene opening;

forming a copper seed layer having a thickness of from about 1000 Angstroms to about 2000 Angstrorns;

carrying out copper electrochemical deposition (ECD) process to fill the dual damascene opening with a copper layer;

carrying out a first annealing process in an atmospheric ambient to anneal the copper layer;

carrying out a CMP process to remove the copper layer and the barrier layer above the trench level including a portion of the second dielectric layer;

carrying out a second annealing process in an inert ambient to anneal the copper layer; and, forming a passivation layer over the copper layer.

10. The method of claim 9, wherein the width and depth of the trench are from about 1 micron to about 5 microns.

11. The method of claim 9, wherein the step of trench etching comprises extending the trench portion into the first dielectric insulating layer while simultaneously removing an etch stop layer overlying the second dielectric insulating layer.

12. The method of claIm 9, wherein the barrier layer comprises one of a refractory metal and refractory metal nitride.

13. The method of claim 9, wherein the first annealing process is carried out at a temperature of from about 200° C. to about 250° C.

14. The method of claim 9, wherein the second annealing process comprises one or more of nitrogen and hydrogen at a temperature of about 250° C. to about 450° C.

15. The method of claim 9, wherein up to about 5000 Angstroms of the second dielectric insulating layer is removed in the CMP process.

16. The method of claim 9, wherein the first and second dielectric insulating layers comprise undoped silicate glass (USG).

17. The method of claim 9, further comprising a first etch stop layer between the first and second dielectric insulating layers outside of the via openings and a second etch stop layer overlying the second dielectric insulating layer.

18. The method of claim 9, wherein the ECD process comprises sequential steps of copper layer deposition followed by partial removal of a portion of the copper layer deposition according to reversed current flow.

* * * * *